US 6,602,786 B2

(12) United States Patent
Lu

(10) Patent No.: US 6,602,786 B2
(45) Date of Patent: Aug. 5, 2003

(54) ONE-STEP PROCESS FOR FORMING TITANIUM SILICIDE LAYER ON POLYSILICON

(75) Inventor: Hamilton Lu, Los Angeles, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/082,532

(22) Filed: Feb. 21, 2002

(65) Prior Publication Data
US 2002/0132456 A1 Sep. 19, 2002

Related U.S. Application Data
(60) Provisional application No. 60/276,360, filed on Mar. 16, 2001.

(51) Int. Cl.[7] .............................................. H01L 21/44
(52) U.S. Cl. ........................ 438/683; 438/655; 438/657; 438/664
(58) Field of Search ................................ 438/683, 655, 438/657, 663, 664

(56) References Cited

U.S. PATENT DOCUMENTS

| | | | | |
|---|---|---|---|---|
| 6,015,753 A | * | 1/2000 | Lin et al. ..................... 438/682 |
| 6,015,997 A | * | 1/2000 | Hu et al. ..................... 257/324 |
| 6,033,978 A | * | 3/2000 | Fujii et al. .................. 438/592 |
| 6,107,154 A | * | 8/2000 | Lin ............................. 438/300 |
| 6,284,635 B1 | * | 9/2001 | Jang ............................ 438/592 |

* cited by examiner

Primary Examiner—Trung Dang
(74) Attorney, Agent, or Firm—Ostrolenk, Faber, Gerb & Soffen, LLP

(57) ABSTRACT

A single rapid thermal anneal (RTA) process is used to form a low resistivity titanium silicide layer atop a polysilicon gate layer for a MOSgated device. The process employs an amorphous silicon layer formed atop the polysilicon layer, followed by forming a titanium layer atop the amorphous silicon. A single RTA process at a temperature below the temperature of contamination diffusion is carried out, preferably at about 650° C. for 30 seconds. The top of the annealed titanium silicide layer is then stripped, and the remaining layer has a sheet Rho of less than about 2 ohms per square.

9 Claims, 2 Drawing Sheets

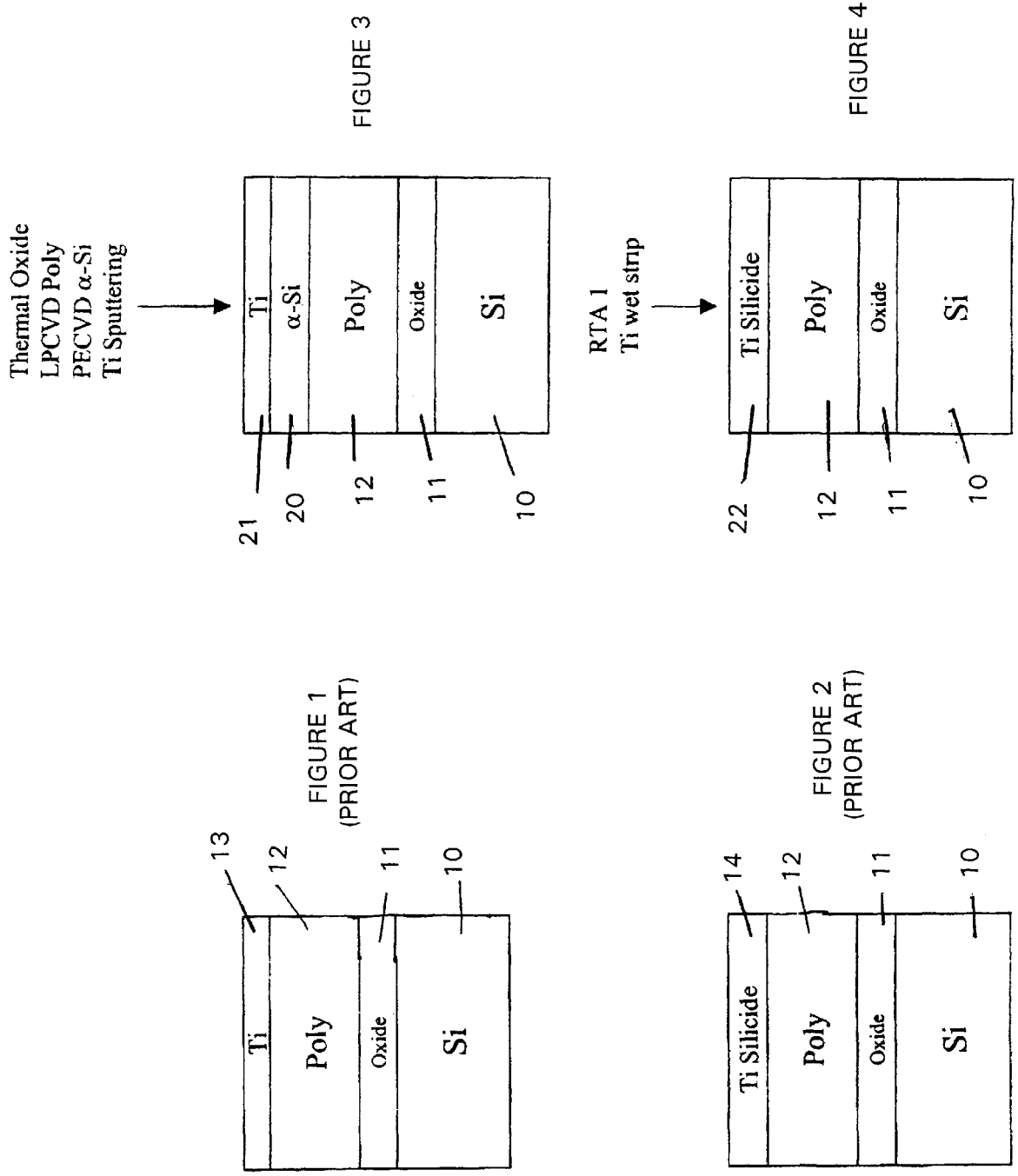

US 6,602,786 B2

ONE-STEP PROCESS FOR FORMING TITANIUM SILICIDE LAYER ON POLYSILICON

RELATED APPLICATION

This application claims the benefit of U.S. Provisional Application No. 60/276,360, filed Mar. 16, 2001.

FIELD OF THE INVENTION

This invention relates to a semiconductor manufacturing process and more specifically relates to a process for forming a low resistance titanium silicide layer atop a polysilicon layer to reduce the lateral resistance of the polysilicon layer.

BACKGROUND OF THE INVENTION

Semiconductor devices, such as power MOSFETs, IGBTs, and the like commonly have thin layers of polysilicon used, for example, as gate electrodes. It is desirable to reduce the lateral resistance of these polysilicon layers and they are commonly doped by impurities such as phosphorous to increase their conductivity. It is also known to further coat the top of the polysilicon layer with a titanium silicide layer of low resistivity.

To obtain this low resistivity titanium silicide layer, a two-step rapid thermal anneal (RTA) process, each at temperature less than about 750° C., is used. The thermal processing should be a temperature less than about 800° C. at which contamination diffusion begins. However, the underlying silicon remains completely clean if the RTA temperature is no greater than 625° C. The use of titanium silicide for this purpose is described in the following: J. Lutze, G. Scott, and M. Manley, "Transistor off-state leakage current induced by TiSi2 pre-amorphizing implant in a 0.20 um CMOS process," *IEEE Trans. Electron Device Lett.*, vol. 20, p. 155, April 2000; Qingfeng Wang, "TiSi2 and CoSi2 SALICIDE Technology and their Application in CMOS," Advanced Process Technology Seminar, AG Associates, Jun. 20 and 21, 1996; J. F. DiGregorio and R. N. Wall, "Small Area Versus Narrow Line Width Effects on the C49 to C54 Transformation of TiSi2," *IEEE Trans. Electron Devices*, vol. 47, p. 313, February 2000; C. Y. Chang and S. M. Sze, "ULSI Technology," The McGraw-Hill Companies, Inc., 1996, ISBN 0-07-063062-3; and S. P. Murarka, "Silicide for VLSI Applications," Academic Press, Inc., 1983, ISBN 0-12-11220-3.

It would be desirable to deposit a low resistivity layer of titanium silicide on polysilicon using a single RTA step.

BRIEF SUMMARY OF THE INVENTION

In accordance with the invention, a titanium silicide layer is formed atop a polysilicon layer surface with a single low temperature (under 650° C.) RTA step. Thus, an intermediate amorphous silicon layer is first formed atop the polysilicon. Titanium is then sputtered atop the amorphous silicon layer, and a single RTA step is carried out at about 625° C. for about 30 seconds, followed by a titanium wet strip, producing the desired low resistivity titanium silicide layer intimately bonded to the polysilicon layer.

BRIEF DESCRIPTION OF THE DRAWINGS

FIG. 1 is a schematic cross-sectional diagram of a silicon wafer, showing the initial steps of thermal oxide growth, low pressure chemical vapor deposition (LPCVD) polysilicon deposition, and Ti sputtering in accordance with a prior art process for forming a titanium suicide layer on polysilicon.

FIG. 2 shows further steps, including two RTA steps which follow the prior art process described with FIG. 1.

FIG. 3 is like FIG. 1 but shows the novel process step of the invention of using an amorphous silicon layer before a titanium sputter step.

FIG. 4 shows the structure of FIG. 3 after a single low temperature RTA step.

DETAILED DESCRIPTION OF THE DRAWINGS

Figure 5:
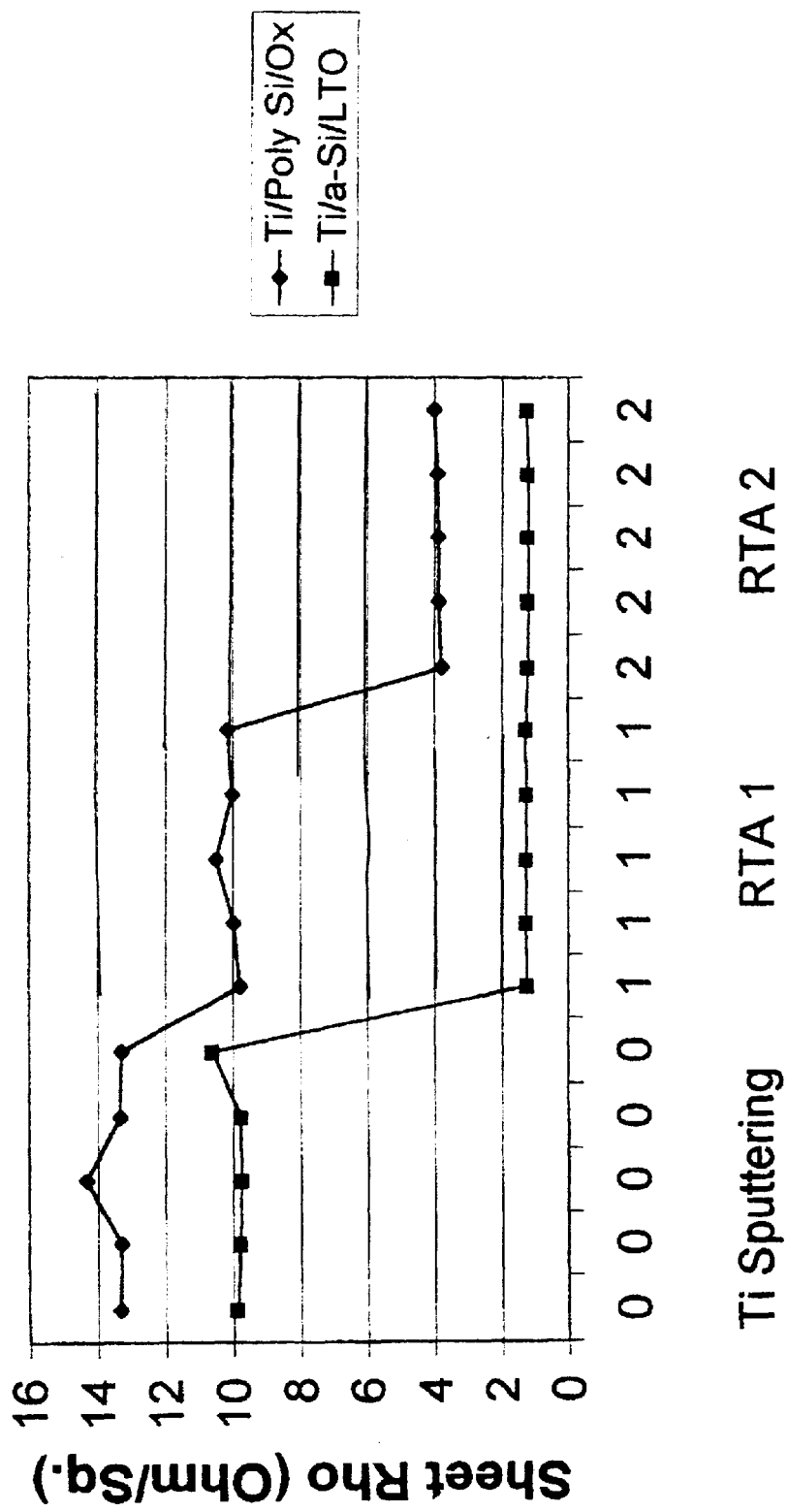
FIG. 5 shows the sheet resistance of the titanium silicide layers of FIG. 2 (dots) and FIG. 4 (squares).

Referring first to FIGS. 1 and 2, there is shown the conventional two-step RTA silicide process which has been used in the semiconductor industry to reduce polysilicon contact and sheet resistance. Thus, a monocrystalline silicon wafer 10 has a thin silicon dioxide layer 11 (a gate oxide for a MOSgated device) thermally grown thereon. A conductive polysilicon layer 12 (gate electrode) is formed over the oxide layer 11 as by a conventional LPCVD process. Thereafter, a thin titanium layer 13 is sputtered atop the polysilicon layer 12 (FIG. 1).

The wafer is next subjected to first RTA process, at about 750° C. for 30 seconds to convert the titanium layer 13 to a titanium silicide 14 (FIG. 2). The titanium silicide 13 first formed is in the C-49 phase. The sheet resistance of layer 13, shown in FIG. 5 in the interval following "Ti Sputtering" and labeled RTA1 is reduced to about 10 ohms/square in the first RTA process.

Thereafter, a wet strip process is used to strip unwanted Ti/Ti N. Next, a second RTA step is carried out, further annealing the titanium silicide at about 750° C. for 30 seconds to obtain the lower sheet resistance phase C-54 of the titanium silicide layer 14. This reduces the sheet resistance to about 4 ohms per square as shown in FIG. 5.

In accordance with the invention, and as shown in FIG. 3, an amorphous silicon layer 20 is first formed atop polysilicon layer 12. Amorphous silicon layer 20 has a non-critical thickness of about 1200 Å to 2400 Å. It is formed as an amorphous silicon capped layer at the end of the polysilicon deposition, or, the amorphous silicon can be deposited in a plasma enhanced chemical vapor deposition (PECVD) process on top of the polysilicon layer 12.

Thereafter, and as shown in FIG. 3, titanium layer 21 is sputtered atop layer 20 to a non-critical thickness of about 600 Å. The wafer is then exposed to a single RTA process at 625° C. for 30 seconds, producing the Ti Silicide layer 22 of FIG. 4. This single RTA step produces Ti Silicide in the desired low resistance C-54 phase as shown in FIG. 5. A wet strip of unwanted Ti/TiN is next carried out. The resulting device had a sheet resistance of about 1 ohm per square as shown in FIG. 5, with a single RTA step, thus obtaining an improved device with a reduced thermal budget and improved manufacturing throughput.

In tests of the present invention, a first process was done with PECVD amorphous silicon/PECVD LTO (low temperature oxide)/PECVD nitride, yielding an improved sheet resistance. A second test was carried out with PECVD amorphous silicon/PECVD LTO which gave still further improved sheet resistance. A third test employed PECVD amorphous silicon/in-situ doped Polysilicon/oxide which also produced very low sheet resistance.

The process of the invention provides a one step RTA Ti Silicide process. Besides capping (Ti/Mo, Mo/Ti, Ti/Co and Co/Ti) and pre-amorphization implant methods, any other process, based on site-induced phase transformation theory can be used to do the 1-step RTA Ti Silicide:

I. Capping Method:

Sputter Mo and then sputter Ti for a dual layer Ti/Mo; sputter Ti and then sputter Mo to form dual layer Mo/Ti; Sputter Ti and Co, and dual layers Ti/Co and Co/Ti can be formed. However, this method introduces another metal, which makes the process more complicated and dirtier.

II. Implant Method:

The poly surface can be implanted by Argon to form the amorphous Si. Ti can be sputtered atop this amorphous Si. The one step RTA Ti silicide process described above can then be completed. This process is expensive because it takes a lot of effort (high power) to convert the poly Si to 1000 Å amorphous Si by implanting Argon.

III. Amorphous Si ($\alpha$-Si) Deposition Method:

This is the preferred embodiment of the invention. The main advantage of this method is the novel 1-step RTA Ti silicide process. Furthermore, it is very beneficial to stack the Ti silicide, namely, Ti/$\alpha$-Si/Ti/$\alpha$-Si/Ti/$\alpha$-Si . . . , and then a 1-step RTA anneal. A Ti silicide with sheet Rho below 2 Ohm/Sq can be obtained. In theory, the lowest sheet resistance can be reached with an infinite number of stacks of Ti/$\alpha$-Si. This method is a clean and cost-effective method to achieve improved poly sheet and contact resistance.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A process for forming a low resistivity titanium silicide layer atop a polysilicon layer comprising the steps of forming by deposition an amorphous silicon layer atop the polysilicon layer; forming a titanium layer atop the amorphous silicon layer; and annealing said titanium at a temperature below that which causes contamination diffusion thereby to form a titanium silicide layer with a sheet resistance less than about 2 ohms per square with a single anneal step.

2. The process of claim 1, wherein said amorphous silicon layer has a thickness of from 1200 Å to 2400 Å.

3. The process of claim 1, wherein said anneal process is a rapid anneal process.

4. The process of claim 3, wherein said rapid anneal process is carried out at about 625° C. for about 30 seconds.

5. The process of claim 1, wherein said titanium layer has a thickness of about 600 Å.

6. The process of claim 1, wherein said titanium layer is annealed at a temperature of less than about 650° C.

7. The process of claim 1, wherein the top of said annealed titanium layer is stripped of residual metallic titanium.

8. The process of claim 2, wherein said titanium layer has a thickness of about 600 Å.

9. The process of claim 3, wherein said titanium is annealed at a temperature of less than about 650° C.

* * * * *